United States Patent

Wu

Patent Number: 5,441,905
Date of Patent: Aug. 15, 1995

[54] PROCESS OF MAKING SELF-ALIGNED AMORPHOUS-SILICON THIN FILM TRANSISTORS

[75] Inventor: Biing-Seng Wu, Hsin Chu, Taiwan

[73] Assignee: Industrial Technology Research Institute, Hsinchu, Taiwan

[21] Appl. No.: 52,519

[22] Filed: Apr. 29, 1993

[51] Int. Cl.6 .................. H01L 21/331; H01L 21/84
[52] U.S. Cl. ..................................... 437/41; 437/101; 437/229; 437/909; 437/187; 437/181
[58] Field of Search ............... 437/40, 41, 181, 909, 437/21, 187, 101, 229

[56] References Cited

U.S. PATENT DOCUMENTS 4,958,205  9/1990  Takeda et al.
5,075,237  12/1991  Wu ................................. 437/43
5,091,337  2/1992  Wantanbe ..................... 437/909

*Primary Examiner*—Olik Chaudhuri
*Assistant Examiner*—Richard A. Booth
*Attorney, Agent, or Firm*—H. C. Lin

[57] ABSTRACT

A thin film transistor structure and fabrication method for active matrix liquid crystal display. The structure is a self-aligned coplanar/staggered one. The feature of this structure is the self-aligned source and drain electrode to minimize the stray capacitance between the gate and the drain and the source. The source and drain electrodes are obtained by exposing negative photoresist on top of the transistor by incident light from the back of the transparent substrate using the gate electrode as a mask.

21 Claims, 5 Drawing Sheets

Two PR processes for ITO

PROCESS OF MAKING SELF-ALIGNED AMORPHOUS-SILICON THIN FILM TRANSISTORS

BACKGROUND

This application is related to thin film transistors, particularly for active matrix liquid crystal displays.

In conventional process for making amorphous silicon (a-Si) thin film transistors (TFT), the TFT has a very large overlap region between the gate and source, and between the gate and the drain. This overlap results in a very large stray capacitance, which degrades the high frequency response and introduces unacceptable DC voltage levels when the transistors are used in a liquid crystal display device. This stray capacitanace should therefore be minimized. The adverse effect due to the gate overlap can be reduced by using self-aligned gate.

In a U.S. patent application Ser. No. 07/495,829, now abandoned, "Process for Making a Self-Aligned Inverted Coplanar/Staggered Amorphous Silicon Thin Film Transistors" it has been disclosed a method for making a self-aligned TFT for reducing the overlap capacitance. The TFT structure is shown in FIG. 1. Due to the novel self-aligned process, the capacitance between the a-Si:H channel 8 and the source/drain n+a-Si:H electrodes 12 is minimized. However, there is an extension Lp of the n+a-Si:H source/drain electrodes Lp over the two ends of the a-Si:H channel 8. This extension exists because the window opening 10 in the n+a-Si:H and the conducting layer 14 over the top of the a-Si:H channel is patterned with a mask over the structure which is not self-aligned with the gate electrode 4. To avoid misalignment, window opening 10 must be made shorter than the channel length itself, The extension results in an overlap Lp which gives rise to substantial capacitance which is undesirable as explained earlier.

SUMMARY

An object of this invention is to make a self-aligned gate TFT with a structure with minimum stray capacitance, Another object of this invention is to implement a process for fabricating the new structure, Still another object of this invention is to reduce the stray capacitance between the gate electrode of the TFT and the source/drain electrodes by means by self-aligned source/drain electrodes.

These objects are achieved in this invention by a novel structure and process, The structure has self-aligned source and drain electrodes, These electrodes are patterned by using the gate electrode as a mask and exposing the negative photoresist on top of the structure with light incident from the back of the structure, The self-aligned source and drain electrodes eliminate the overlap stray capacitance between the gate electrode and the source/drain electrodes.

DESCRIPTION OF THE PREFERRED EMBODIMENT

Figure 1:
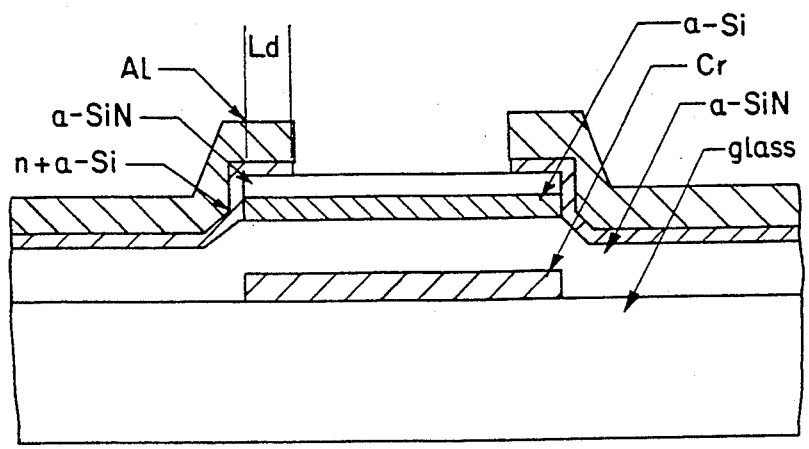
Figure 2A:
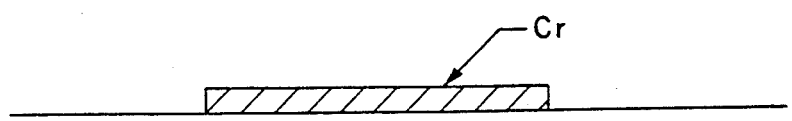

One embodiment of the present invention, designated as Type-A, is shown in FIG. 2(a). There are a number of processing steps:

(1) Deposit a layer of chromium Cr on a transparent glass substrate and use the photolithographic technique to pattern a gate electrode as shown in FIG. 2(a).

(2) Deposit an amorphous silicon nitride (a-SiN) layer, an amorphous silicon (a-Si)layer, and a top passivation amorphous silicon nitride (a-SiN) layer continuously.

(3) Coat a layer of positive photoresist.

(4) Expose the photoresist, using the Cr film as self-aligned mask, and develop the photoresist, leaving the unexposed photoresist on top of the Cr gate.

Figure 2B:
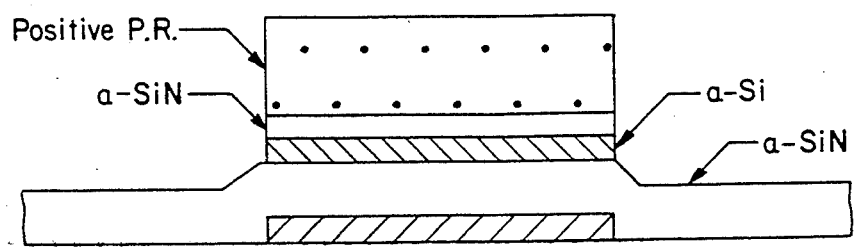

(5) Etch the top a-SiN and a-Si films. The cross-section after etching is shown in FIG. 2(b).

Figure 2C:
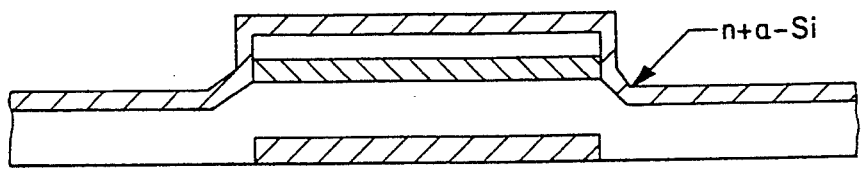

(6) After removing the photoresist, deposit a thin layer of heavily doped amorphous silicon (n+a-Si) film as shown in FIG. 2(c).

Figure 2D:
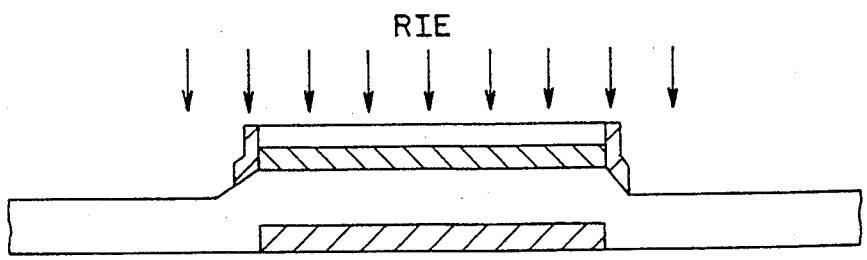

(7) Using reactive ion etching technique (RIE), etch the n+a-Si film. Because the top a-SiN film and the a-Si film are thicker than the n+a-Si film and the RIE is an anisotropic etching, the edge of the top SiN and a-Si is left with a ring of n+a-Si film as shown in FIG. 2(d).

Figure 2E:
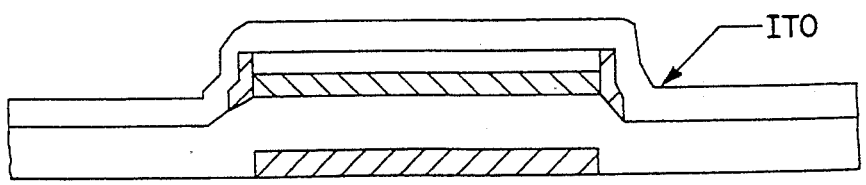

(8) Deposit a layer of transparent, conductive indium tin oxide (ITO) film over the above structure as shown in FIG. 2(e).

Figure 2F:
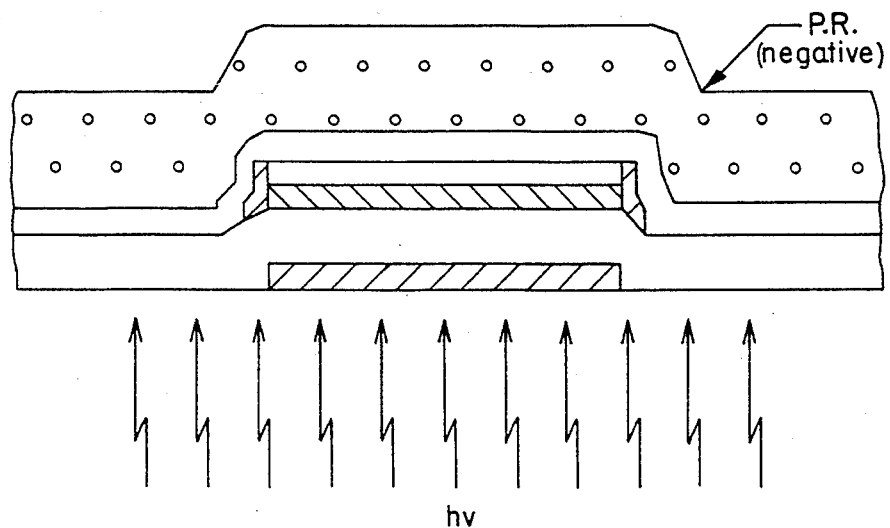

(9) Coat a layer of negative photoresist over the foregoing structure as shown in FIG. 2(f).

Figure 2G:
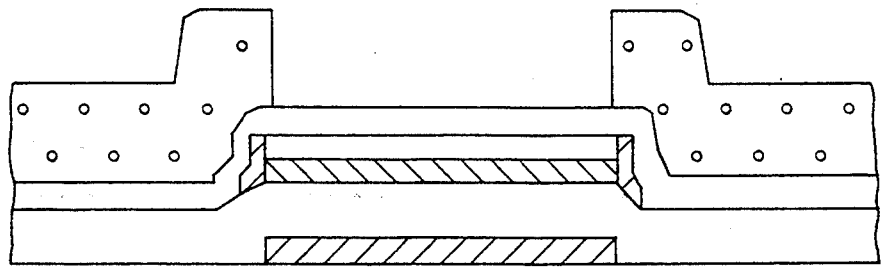

(10) Expose the backside of the structure in FIG. 2(f) and result in the structure shown in FIG. 2(g) after development.

Figure 2H:
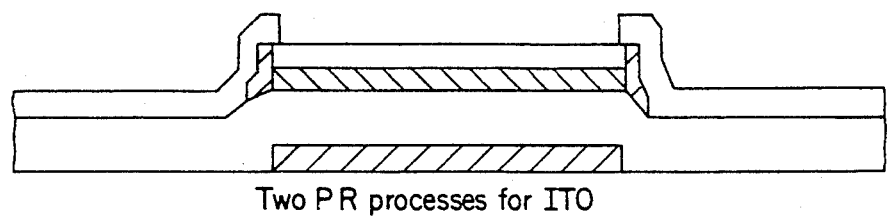

(11) Etch the ITO to form a structure as shown in FIG. 2(H).

(12) Using conventional photolithographic technique, pattern the ITO pixel electrode. The cross-sectional view is the same as FIG. 2(g).

(13) Using conventional photolithographic technique, etch the top of the a-SiN and the a-Si films, and to define the channel width of the TFT.

Figure 2I:
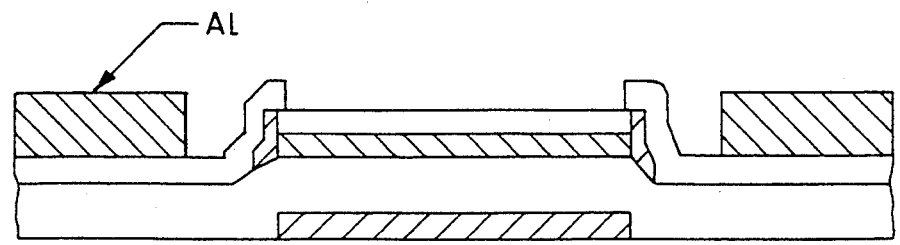

(14) Deposit and pattern an aluminum layer as interconnection for the TFTLCD as shown in FIG. 2(i). This step may not be needed, if the ITO layer is used as interconnection. However, the ITO layer has higher sheet resistance than the aluminum.

Figure 3A:
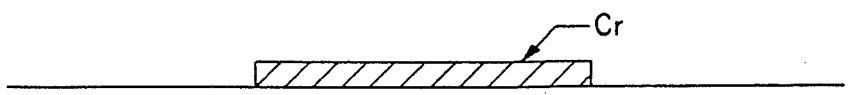

Another embodiment of the present invention, designated as type-B, is constructed in the following steps:

(1) Deposit a Cr layer over a glass substrate and pattern a gate electrode as shown in FIG. 3(a).

Figure 3B:
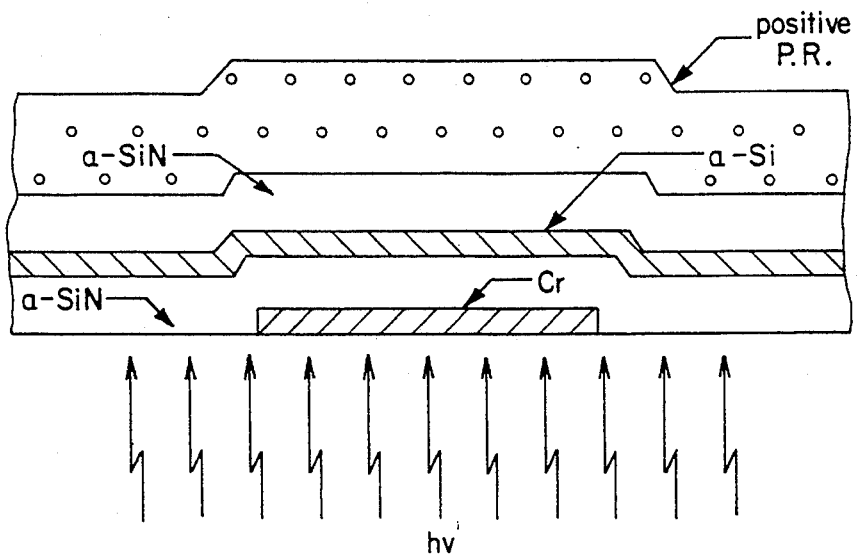

(2) Deposit successively an a-SiN, an a-Si and a top SiN layers, and coat them with a layer of positive photoresist as shown in FIG. 3(b).

(3) Similar to the type-A process, a layer of positive photoresist is patterned over the Cr gate, utilizing the transparent property of amorphous material and the masking property of the Cr.

Figure 3C:
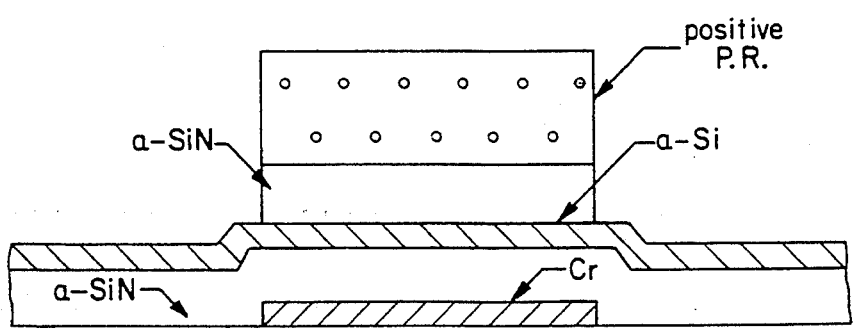

(4) Etch the top SiN layer until the a-Si layer appears, as shown in FIG. 3(c), and then strip the positive photoresist.

Figure 3D:
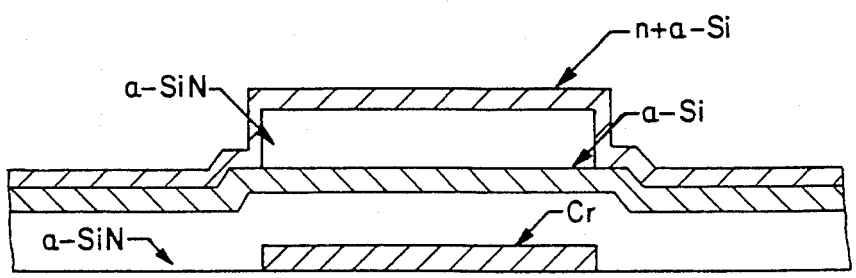
Figure 3E:
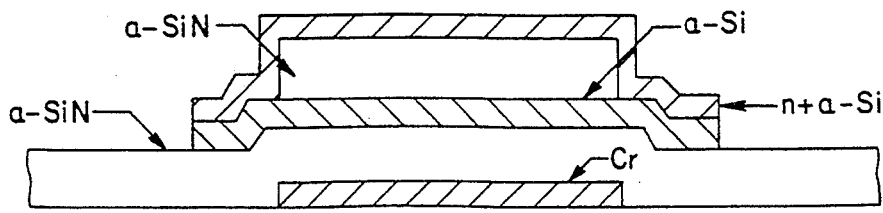

(5) Deposit an n+a-Si layer as shown in FIG. 3(D) and use conventional photolithogrphy to pattern the active region of the TFT as shown in FIG. 3(e).

Figure 3F:
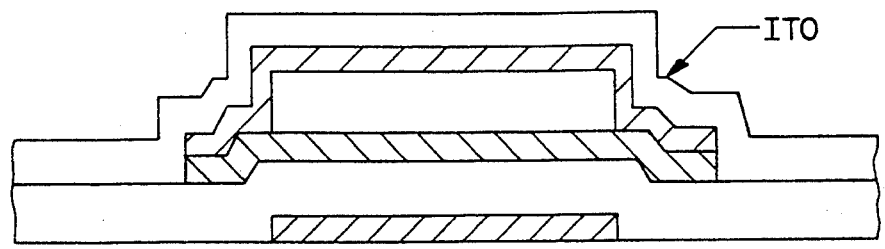

(6) Deposit a layer of transparent ITO film as shown in FIG. 3(f).

Figure 3G:
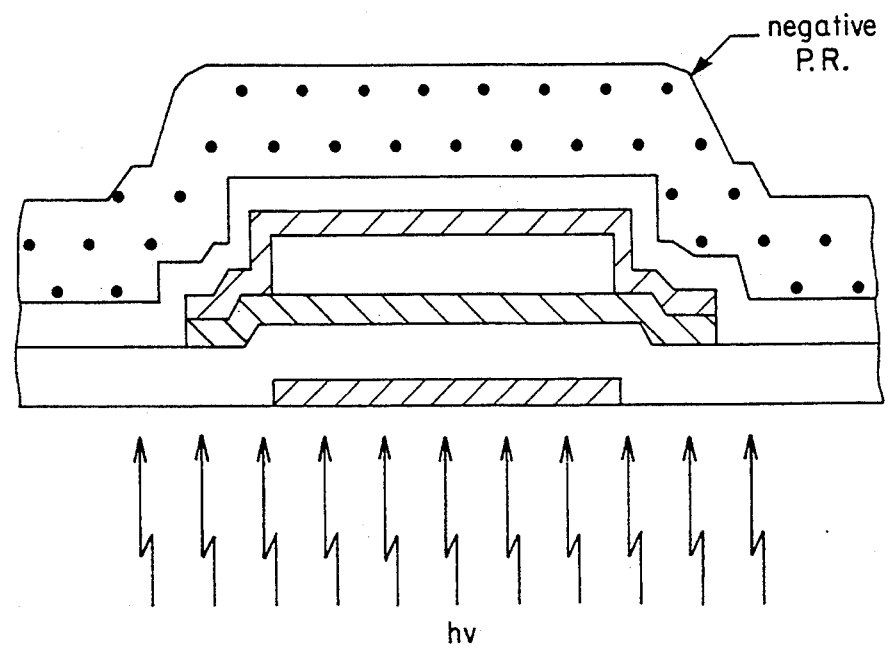
Figure 3H:
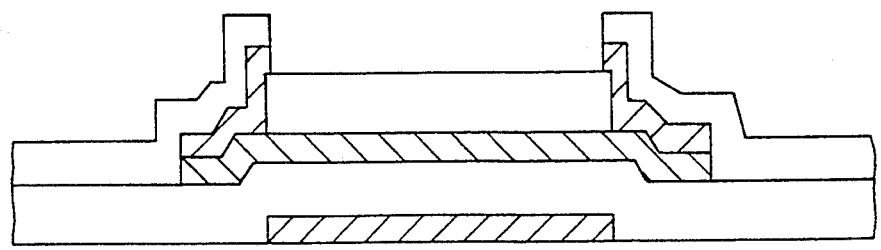

(7) Repeat steps 9 through 14 in the first embodiment. The cross-sectional views of the following processes are shown in FIG. 3(g) to FIG. 3(i).

Figure 3I:
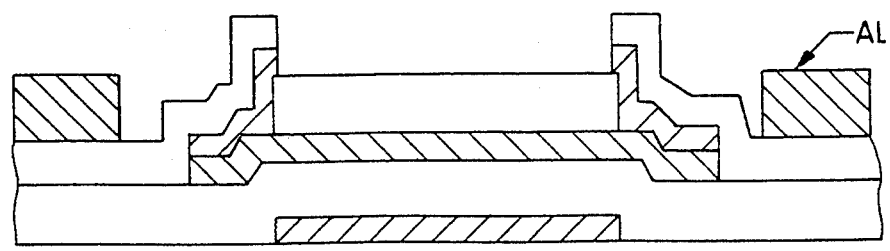

(8) For lowering the resistance of the data line for the TFTLCD, form an aluminum electrode as shown in FIG. 3(i).

Figure 4A:
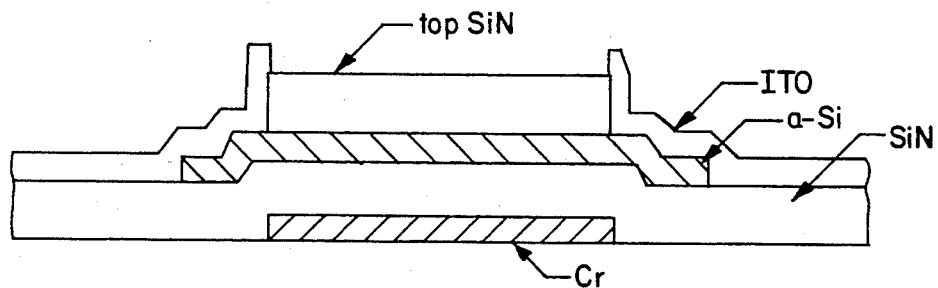
Figure 4B:
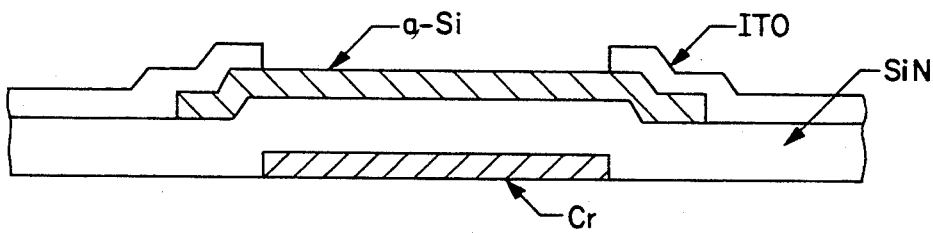
Figure 4C:
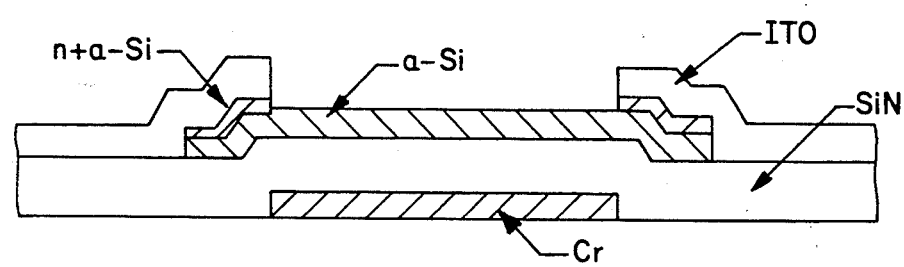
Figure 4D:
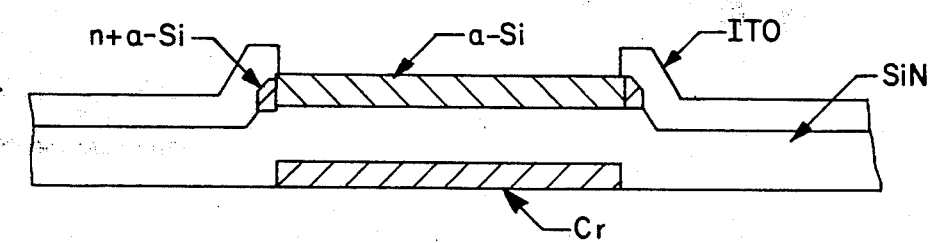
Figure 4E:
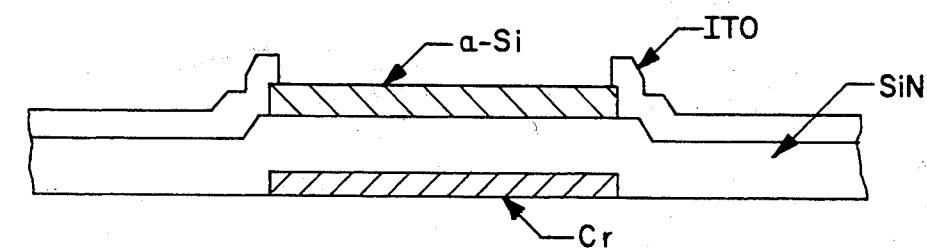

There are other similar structures. Some of these structures are shown in FIGS. 4(a)–(e). In FIG. 4(a), no n+a-Si:H contact material is used and the conducting ITO electrode is in direct contact with the channel. In FIG. 4(b), the structure in FIG. 4(a) is further simplified by eliminating the SiN passivation layer. In FIG. 4(c), the SiN passivation layer is not used. In FIG. 4(d), the structure is similar to FIG. 4(C) except that the a-Si channel is made the same length as the gate electrode. In FIG. 4(e), the structure is similar to FIG. 4(d) except that no contact n+a-Si is eliminated.

What is claimed is:

1. A method of fabricating a thin film transistor having a gate, a channel, a source and a drain, comprising the steps of:
   depositing and patterning a gate electrode on a transparent substrate,
   depositing successively a gate dielectric layer and an amorphous semiconductor layer on said gate electrode,
   depositing a positive photoresist layer on said amorphous semiconductor layer,
   patterning said amorphous semiconductor layer with the gate as mask for self-alignment,
   depositing a first conducting layer over said substrate,
   depositing a negative photoresist over said first conducting layer,
   exposing and developing said negative photoresist with light incident from the back of said substrate using said gate electrode as a mask,
   removing said first conducting layer in a portion to create source and drain electrodes such that said source and drain electrodes are self-aligned with said gate electrode without overlap between said gate electrode and said source electrode, and between said gate electrode and said drain electrode,
   depositing and patterning a second conducting layer over said first conducting layer.

2. A method of fabricating a thin film transistor having a gate, channel, source, and drain comprising the steps of:
   depositing and patterning a gate electrode on a transparent substrate,
   depositing successively a gate dielectric and a semiconductor layer on said gate electrode,
   depositing a passivation layer and a positive photoresist layer over said semiconductor layer, and using incident light from the back of said substrate and the gate electrode as a mask to expose a portion of said positive photoresist layer,
   using said unexposed portion of said positive photoresist as a mask to pattern said passivation layer,
   patterning said semiconductor layer using a mask larger than said gate,
   depositing a first conducting layer and a negative photoresist over said substrate,
   exposing said negative photoresist layer with light incident from the back of the substrate using the gate electrode as a mask,
   etching said first conductor layer to create source/drain electrodes self-aligned with said gate electrode,
   depositing and patterning a second conducting metal layer over said source/drain electrodes.

3. A method of fabricating a thin film transistor as described in claim 2, comprising the additional steps of:
   (a) after the step of depositing successively said gate dielectric layer and said semiconductor layer, further comprising a step of depositing a doped semiconductor layer over said substrate,
   (b) in the step of patterning said semiconductor layer, further comprising the step of patterning said doped semiconductor layer.

4. A method of fabricating a thin film transistor as described in claim 2, wherein said gate is of chromium.

5. A method of fabricating a thin film transistor as described in claim 2, wherein said semiconductor is amorphous silicon.

6. A method of fabricating a thin film transistor as described in claim 2, wherein said passivation layer is silicon nitride.

7. A method of fabricating a thin film transistor as described in claim 3, wherein said second semiconductor is doped amorphous silicon.

8. A method of fabricating a thin film transistor as described in claim 2, wherein said first conducting layer is transparent.

9. A method of fabricating a thin film transistor as described in claim 2, wherein said first conducting layer is indium-tin oxide.

10. A method of fabricating a thin film transistor as described in claim 2, wherein said second conducting layer is aluminum.

11. A method of fabricating a thin film transistor as described in claim 2, after the step of depositing a passivation layer, further comprising:
    the step of depositing a doped semiconductor layer over said substrate.

12. A method of fabricating thin film transistors as described in claim 2, wherein said transparent insulating substrate is glass.

13. A method of fabricating a thin film transistor as described in claim 2, wherein said semiconductor is amorphous silicon.

14. A method of fabricating a thin film transistor as described in claim 4, wherein said doped semiconductor is doped amorphous silicon.

15. A method of fabricating a thin film transistor as described in claim 2, wherein said passivation layer is silicon nitride.

16. A method of fabricating a thin film transistor as described in claim 2, wherein said first conducting layer is indium-tin oxide.

17. A method of fabricating a thin film transistor as described in claim 2, wherein said second conducting layer is aluminum.

18. A method of fabricating a thin film transistor as described in claim 1, further comprising:
    a step of depositing a passivation layer after the step of depositing successively a gate dielectric layer and an amorphous semiconductor layer, and patterning said passivation layer in the same step as the patterning of said amorphous semiconductor layer.

19. A method of fabricating a thin film transistor as described in claim 1, further comprising the steps of:
    removing said positive photoresist,
    depositing doped semiconductor layer after removing said positive photoresist, and
    removing said doped semiconductor layer by photolithography except where said doped semiconductor layer is on and immediately adjacent sidewalls of said patterned amorphous semiconductor layer.

20. A method of fabricating a thin film transistor as described in claim 18, after the step of patterning said amorphous semiconductor layer, further comprising the steps of:
    removing said positive photoresist,
    depositing a doped semiconductor layer, and removing said doped semiconductor layer except where said doped semiconductor layer is on and immediately adjacent the sidewalls of said patterned amorphous semiconductor layer and said patterned passivation layer by photolithography.

21. A method of fabricating a thin-film transistor as described in claim 20, wherein the step of removing said doped semiconductor layer is accomplished by reactive ion etching.

* * * * *